United States Patent
Lee et al.

(10) Patent No.: US 9,984,748 B1
(45) Date of Patent: May 29, 2018

(54) ELECTRONIC DEVICE AND METHOD FOR READING DATA STORED IN RESISTIVE MEMORY CELL

(71) Applicant: SK hynix Inc., Icheon (KR)

(72) Inventors: Seung-Hwan Lee, Seoul (KR);
Woo-Tae Lee, Seoul (KR);
Hyun-Jeong Kim, Yongin (KR);
Myoung-Sub Kim, Seongnam (KR);
Tae-Hoon Kim, Seongnam (KR)

(73) Assignee: SK HYNIX INC., Icheon (KR)

(*) Notice: Subject to any disclaimer, the term of this patent is extended or adjusted under 35 U.S.C. 154(b) by 0 days. days.

(21) Appl. No.: 15/604,474

(22) Filed: May 24, 2017

Related U.S. Application Data

(60) Provisional application No. 62/341,007, filed on May 24, 2016.

(51) Int. Cl.
*G11C 11/00* (2006.01)
*G11C 13/00* (2006.01)
*G06F 3/06* (2006.01)
*G11C 13/04* (2006.01)

(52) U.S. Cl.
CPC ............ *G11C 13/004* (2013.01); *G06F 3/061* (2013.01); *G06F 3/0659* (2013.01); *G06F 3/0679* (2013.01); *G11C 13/047* (2013.01); *G11C 2013/0042* (2013.01)

(58) Field of Classification Search
CPC ............... G11C 13/004; G11C 13/047; G11C 2013/0042; G06F 3/0659; G06F 3/0679; G06F 3/061
See application file for complete search history.

(56) References Cited

U.S. PATENT DOCUMENTS

| | | | |
|---|---|---|---|
| 7,751,226 B2 | 7/2010 | Kau | |
| 2005/0180216 A1 | 8/2005 | Lowrey | |
| 2013/0051123 A1* | 2/2013 | Lee | G11C 8/00 365/148 |
| 2014/0299950 A1* | 10/2014 | Kim | H01L 43/08 257/421 |
| 2015/0294716 A1* | 10/2015 | Tortorelli | G11C 13/004 365/163 |

* cited by examiner

*Primary Examiner* — Mohammed A Bashar

(57) ABSTRACT

A semiconductor memory includes a cell array including a plurality of resistive memory cells arranged in a plurality of columns and a plurality of rows, the plurality of resistive memory cells having a snapback characteristic; and a read circuit configured to apply a read voltage to a memory cell selected among the plurality of resistive memory cells, and sense data stored in the selected memory cell by determining whether or not a snapback phenomenon has occurred in the selected memory cell, wherein the read voltage has a level higher than a level of a first voltage and lower than a level of a second voltage, wherein the snapback phenomenon occurs when the first voltage is applied to the selected memory cell in a case where the selected memory cell stores first data, and wherein the snapback phenomenon occurs when the second voltage is applied to the selected memory cell in a case where the selected memory cell stores second data.

13 Claims, 10 Drawing Sheets

ELECTRONIC DEVICE AND METHOD FOR READING DATA STORED IN RESISTIVE MEMORY CELL

CROSS-REFERENCE TO RELATED APPLICATIONS

This application claims the benefit of U.S. Provisional Application No. 62/341,007 filed May 24, 2016, the entire contents of which are incorporated herein by reference.

BACKGROUND

1. Field

Exemplary embodiments of the present patent document relate to a memory circuit or device and its application in an electronic device.

2. Description of the Related Art

Recently, next generation memory devices for replacing DRAMs and flash memories have been actively studied. One of such next generation memory devices is a resistive memory device which uses a material capable of switching between at least two different resistant states by abrupt resistance change according to applied bias, that is, a variable resistance material, and a representative example thereof may include an RRAM (resistive random access memory), a PRAM (phase-change random access memory), an MRAM (magnetic random access memory), an FRAM (ferroelectric random access memory), etc.

In particular, in the resistive memory device, a memory cell array is configured in a cross point array structure. The cross point array structure means the structure in which a plurality of bottom electrodes (e.g., a plurality of row lines) and a plurality of top electrodes (e.g., a plurality of column lines) are formed to intersect with each other and memory cells, in each of which a variable resistance element and a selection element are electrically coupled in series, are arranged at respective intersections.

FIG. 1 illustrates the cell array structure of a conventional resistive memory.

Referring to FIG. 1, the cell array of the resistive memory includes a plurality of row lines (also referred to as word lines) ROW1 to ROW3, a plurality of column lines (also referred to as bit lines) COL1 to COL3, and memory cells M11 to M33 formed at the respective intersections of the plurality of row lines ROW1 to ROW3 and the plurality of column lines COL1 to COL3. The respective memory cells M11 to M33 have patterns in which variable resistance elements R11 to R33 each having a high resistant state or a low resistant state according to the logic value of stored data and selection elements D11 to D33 are electrically coupled in series. Diodes are generally used as the selection elements D11 to D33.

FIG. 2 represents voltage levels that are applied to the cell array in the case of reading the data stored in the memory cell M22 of FIG. 1.

Referring to FIG. 2, a ground voltage VSS is applied to the selected row line ROW2 corresponding to the selected memory cell M22, and a read voltage Vr is applied to the unselected row lines ROW1 and ROW3. Also, the read voltage Vr is applied to the selected column line COL2 corresponding to the selected memory cell M22, and a voltage Vr/2 as ½ of the read voltage Vr is applied to the unselected column lines COL1 and COL3.

Since a voltage by the read voltage Vr is applied to both ends of the selected memory cell M22 and only a voltage equal to or less than the voltage Vr/2 as ½ of the read voltage Vr is applied to both ends of the unselected memory cells M11, M12, M13, M21, M23, M31, M32 and M33, a current path is formed from the selected column line COL2 to the selected row line ROW2 only through the selected memory cell M22. In the case where the variable resistance element R22 of the selected memory cell M22 has the high resistant state, a relatively small amount of current flows from the selected column line COL2 to the selected row line ROW2, and in the case where the variable resistance element R22 of the selected memory cell M22 has the low resistant state, a relatively large amount of current flows from the selected column line COL2 to the selected row line ROW2. Therefore, it is possible to read the data stored in the selected memory cell M22 by sensing the amount of current flowing through the selected column line COL2.

Such a memory cell reading scheme may be encountered with difficulties in current sensing because the difference between the amounts of current flowing from the selected column COL2 to the selected row line ROW2 according to the high resistant state and the low resistant state of the variable resistance element (e.g., the variable resistance element R22) of a selected memory cell (e.g., the memory cell M22) is not large. In addition, most read circuits, which operate according to a current sensing scheme, have substantially large circuit areas, and the operation speeds thereof are also slow.

SUMMARY

Various embodiments are directed to providing an electronic device capable of reading data of a resistive memory accurately and quickly with a simple circuit.

In an embodiment, an electronic device may include a semiconductor memory, and the semiconductor memory may include a cell array including a plurality of resistive memory cells arranged in a plurality of columns and a plurality of rows; and a read circuit configured to apply a read voltage to both ends of a memory cell selected among the plurality of resistive memory cells, and sense data by determining whether or not a snapback phenomenon has occurred in the selected memory cell, wherein the read voltage is higher than a level of a first voltage which causes the snapback phenomenon when being applied to both ends of the selected memory cell in the case where data stored in the selected memory cell is first data, and is lower than a level of a second voltage which causes the snapback phenomenon when being applied to both ends of the selected memory cell in the case where data stored in the selected memory cell is second data.

Implementations of the above electronic device may include one or more the following. Each of the plurality of resistive memory cells may comprise: a variable resistance element having a high resistant state or a low resistant state according to a logic value of stored data; and a selection element electrically coupled in series with the variable resistance element, and wherein the selection element has a snapback characteristic.

The selection element may be an OTS (Ovonic threshold switch) element.

The read circuit may determine whether or not the snapback phenomenon has occurred, by sensing a voltage change at both ends of the selected memory cell after application of the read voltage.

The cell array may comprise a plurality of column lines and a plurality of row lines, and wherein each of the plurality of resistive memory cells is electrically coupled to one column line of the plurality of column lines and one row line of the plurality of row lines.

The read circuit may comprise: a first transistor configured to apply the read voltage to a column line corresponding to the selected memory cell; a second transistor configured to transfer a voltage level of the column line corresponding to the selected memory cell, to a first node; a third transistor configured to discharge charges of a charge node in response to a voltage level of the first node; a capacitor electrically coupled to the charge node; a fourth transistor configured to electrically couple the charge node and a sensing node; a fifth transistor configured to transfer a precharge voltage to the sensing node; and a sense amplifier configured to sense a voltage level of the sensing node.

An operation of the read circuit may be performed in order of a precharge period, a read voltage application period and a sensing period, wherein the fifth transistor and the fourth transistor are turned on during the precharge period, wherein the first transistor is turned on during the read voltage application period, and the second transistor is turned on at a time later than the first transistor during the read voltage application section, and wherein the fourth transistor is turned on during the sensing period.

The electronic device may further include a microprocessor which includes: a control unit that is configured to receive a signal including a command from an outside of the microprocessor, and performs extracting, decoding of the command, or controlling input or output of a signal of microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the resistance variable element is part of the auxiliary memory device or the main memory device in the processing system.

The electronic device may further comprise a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect, a method for reading data of a resistive memory cell having a snapback characteristic is provided. The method may comprise: applying a read voltage to both ends of the memory cell; and sensing data by determining whether or not a snapback phenomenon has occurred in the memory cell, after application of the read voltage, wherein the read voltage is higher than a level of a first voltage which causes the snapback phenomenon when being applied to both ends of the memory cell in the case where data stored in the memory cell is first data, and is lower than a level of a second voltage which causes the snapback phenomenon when being applied to both ends of the memory cell in the case where data stored in the selected memory cell is second data.

Implementations of the above method may include one or more the following.

The memory cell may comprise: a variable resistance element; and a selection element electrically coupled in series with the variable resistance element, and wherein the selection element has a snapback characteristic.

In the sensing, whether or not the snapback phenomenon has occurred may be determined by sensing a voltage change at both ends of the memory cell after application of the read voltage.

DETAILED DESCRIPTION

Figure 1:
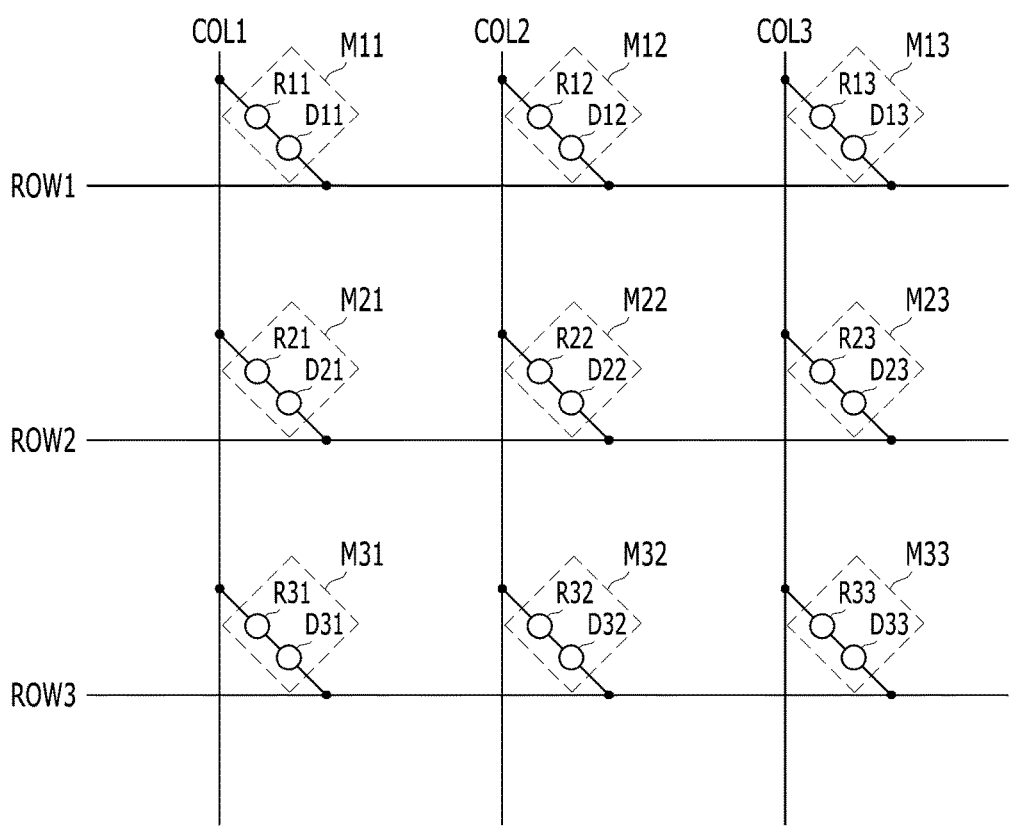
FIG. 1 is a diagram illustrating a cell array structure of a conventional resistive memory.
Figure 2:
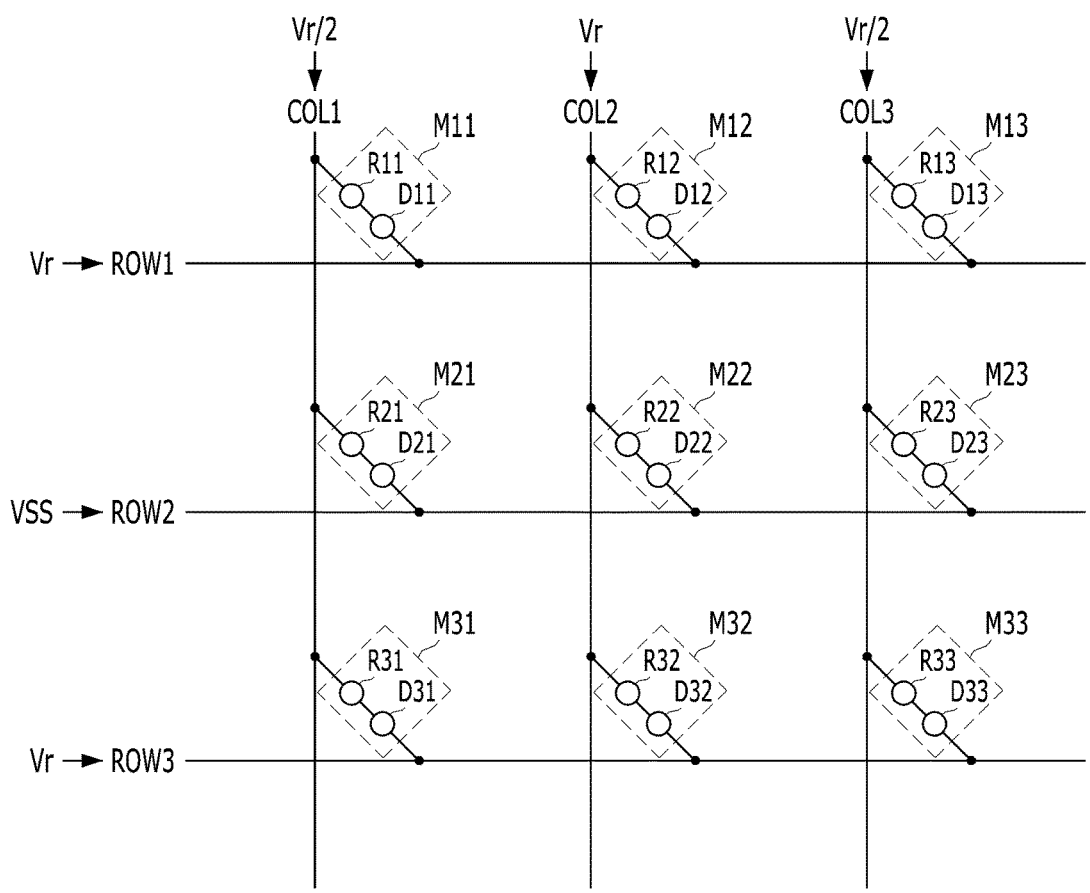
FIG. 2 a diagram illustrating voltages applied to a cell array in the case of reading data stored in a memory cell of FIG. 1.

Various embodiments will be described below in more detail with reference to the accompanying drawings. The present invention may, however, be embodied in different forms and should not be construed as limited to the embodiments set forth herein. Rather, these embodiments are provided so that this document will be thorough and complete, and will fully convey the scope of the present invention to those skilled in the art. Throughout the disclosure, like reference numerals refer to like parts throughout the various figures and embodiments of the present invention.

In the following embodiments, a snapback phenomenon is utilized. The snapback phenomenon will be described below.

Figure 3:
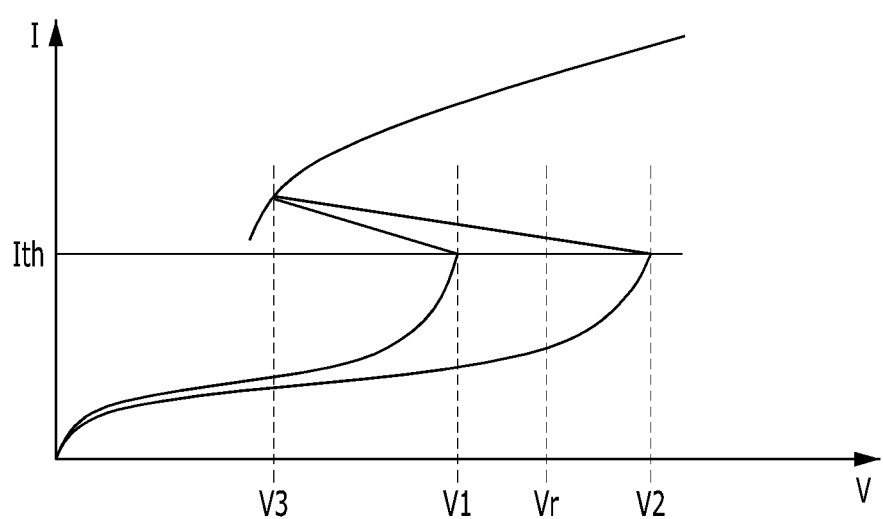
FIG. 3 is an I-V curve representing a snapback phenomenon occurring in a memory cell.

FIG. 3 is an I-V curve representing a snapback phenomenon occurring in a memory cell. The memory cell may include a variable resistance element, which has a high resistance state (also referred to as a RESET state) or a low resistance state (also referred to as a SET state) according to a logic value of stored data, and a selection element, which is electrically coupled in series with the variable resistance element. The selection element may have a snapback characteristic.

FIG. 3 illustrates amounts of current according to voltages applied to both ends of the memory cell. Regardless of whether the memory cell is in the high resistance state (the RESET state) or in the low resistance state (the SET state), the higher the level of the voltage applied to both ends of the memory cell, the greater the amount of current flowing through the memory cell. At the same voltage level, a greater amount of current may flow through the memory cell in the low resistance state (the SET state) than through the memory cell in the high resistance state (the RESET state).

If a voltage at both ends of the memory cell which is in the low resistance state reaches a first voltage V1 (e.g., approximately 3V), that is, if an amount of current flowing through the memory cell which is in the low resistance state (the SET state) reaches a threshold value Ith, a snapback phenomenon may occur in the memory cell that is in the low resistance state (the SET state). If the snapback phenomenon occurs, a level of the voltage at both ends of the memory cell that is in the low resistance state (the SET state) may abruptly decrease, and may drop to a third voltage V3 (e.g., approximately 1.5V).

If a voltage at both ends of the memory cell that is in the high resistance state reaches a second voltage V2 (e.g., approximately 5V), that is, if an amount of current flowing through the memory cell that is in the high resistance state (the RESET state) reaches the threshold value Ith, a snapback phenomenon may occur in the memory cell that is in the high resistance state (the RESET state). If the snapback phenomenon occurs, a level of the voltage at both ends of the memory cell that is in the high resistance state (the RESET state) may abruptly decrease, and may drop to the third voltage V3 (e.g., approximately 1.5V). Regardless of whether the memory cell is in the low resistance state (the SET state) or in the high resistance state (the RESET state), substantially the same I-V characteristic may be obtained after the occurrence of the snapback phenomenon, i.e., the level of the voltage at both ends of the memory cell drops to the third voltage V3.

The snapback phenomenon may refer to a phenomenon where a level of a voltage at both ends of a memory cell abruptly decreases when the voltage at both ends of the memory cell reaches a certain voltage V1 or V2 according to whether the memory cell is in a low resistance state or a high resistance state, respectively. The levels of the voltages V1 and V2 at which the snapback phenomenon occurs in the memory cell may be different from each other according to a logic value of data stored in the memory cell.

A voltage Vr of FIG. 3 represents a read voltage to be used in the following embodiments. The read voltage Vr may have a level that is higher than that of the first voltage V1 and lower than that of the second voltage V2.

Figure 4:
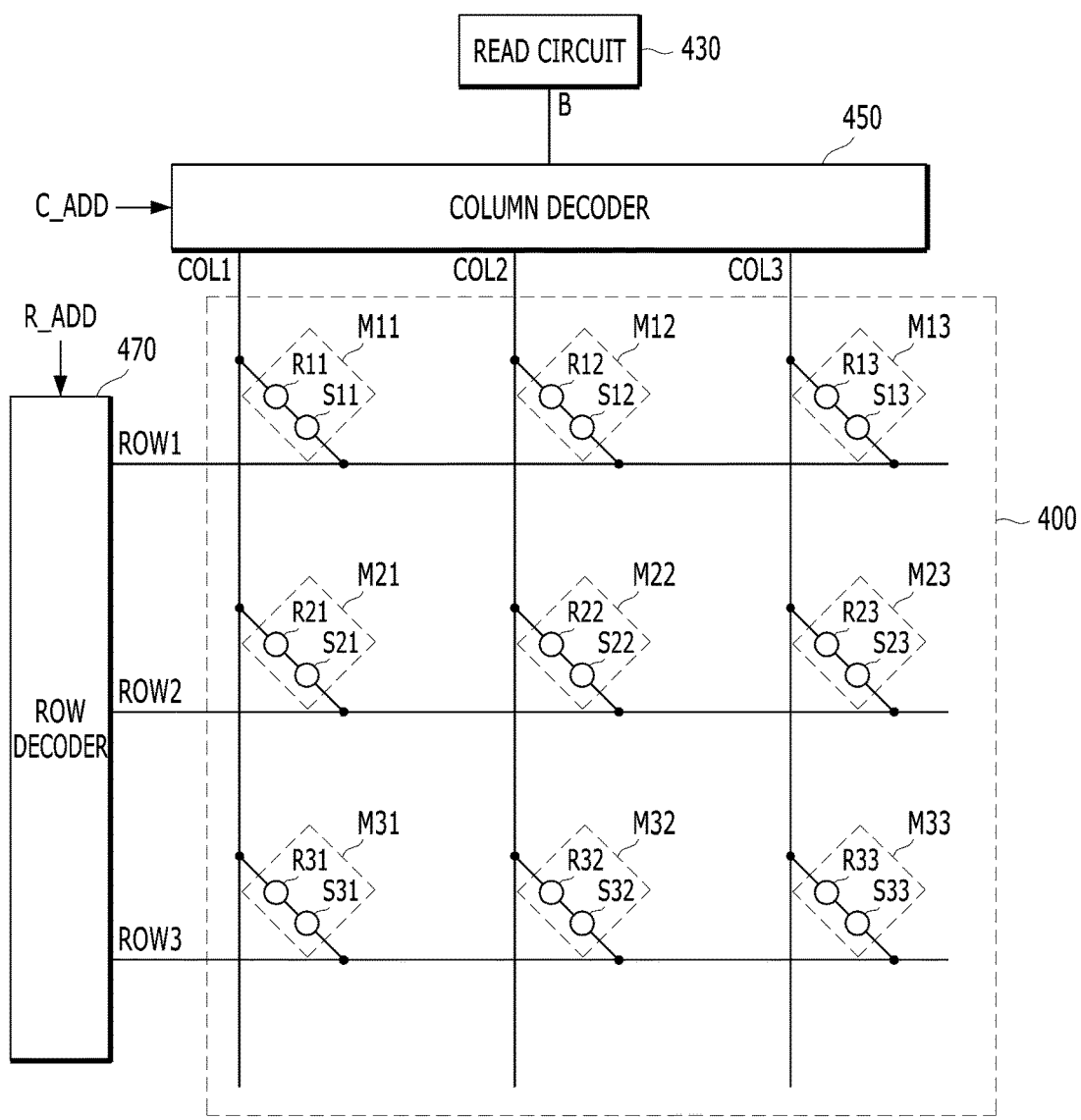
FIG. 4 is a configuration diagram of a semiconductor device in accordance with an embodiment.

FIG. 4 is a configuration diagram of a semiconductor device in accordance with an embodiment.

Referring to FIG. 4, the semiconductor device may include a cell array 400, a read circuit 430, a column decoder 450, and a row decoder 470.

The cell array 400 may include a plurality of column lines COL1 to COL3 (also referred to as bit lines), a plurality of row lines ROW1 to ROW3 (also referred to as word lines), and memory cells M11 to M33 formed at respective intersections of the plurality of column lines COL1 to COL3 and the plurality of row lines ROW1 to ROW3. For the sake of convenience of explanation, the cell array 400 is illustrated here as including three row lines and three column lines, but it is to be understood that the cell array 400 may include several tens to several hundreds of row lines and several tens to several hundreds of column lines.

Each of the memory cells M11 to M33 may include a corresponding one of variable resistance elements R11 to R33 and a corresponding one of selection elements S11 to S33. Each of the variable resistance elements R11 to R33 has a low resistance state (also referred to as a SET state) if first data (e.g., data 0) is stored, and has a high resistance state (also referred to as a RESET state) if second data (e.g., data 1) is stored. The selection elements S11 to S33 are coupled in series with the variable resistance elements R11 to R33, respectively. An element exhibiting a snapback characteristic may be used as the selection elements S11 to S33, and a typical example of such an element may be an OTS (Ovonic threshold switch) element.

In the memory cells M11 to M33 shown in FIG. 4, the variable resistance elements R11 to R33 are disposed on the sides of the column lines COL1 to COL3 and the selection elements S11 to S33 are disposed on the sides of the row lines ROW1 to ROW3, but the positions thereof may be changed.

The column decoder 450 may couple a selected column line of the column lines COL1 to COL3, which is selected based on a column address C_ADD, to a read circuit 430, and apply an appropriate voltage to unselected column lines. The row decoder 470 may apply appropriate voltages to the row lines ROW1 to ROW3 to distinguish a selected row line of the row lines ROW1 to ROW3, which is determined based on a row address R_ADD, from unselected row lines of the row lines ROW1 to ROW3.

The read circuit 430 may read data from a selected memory cell of the memory cells M11 to M33, i.e., a memory cell corresponding to the selected column line and the selected row line. The read circuit 430 may apply a read voltage Vr to the selected memory cell and sense data stored in the selected memory cell by determining whether or not a snapback phenomenon has occurred in the selected memory cell. The read voltage Vr may have a higher voltage level than that of a first voltage V1 at which a snapback phenomenon occurs in a memory cell in a low resistance state (a SET state), but lower than that of a second voltage V2 at which a snapback phenomenon occurs in a memory cell in a high resistance state (a RESET state), as shown in FIG. 3. A configuration and an operation of the read circuit 430 will be described in detail with reference to FIGS. 5 and 6.

Figure 5:
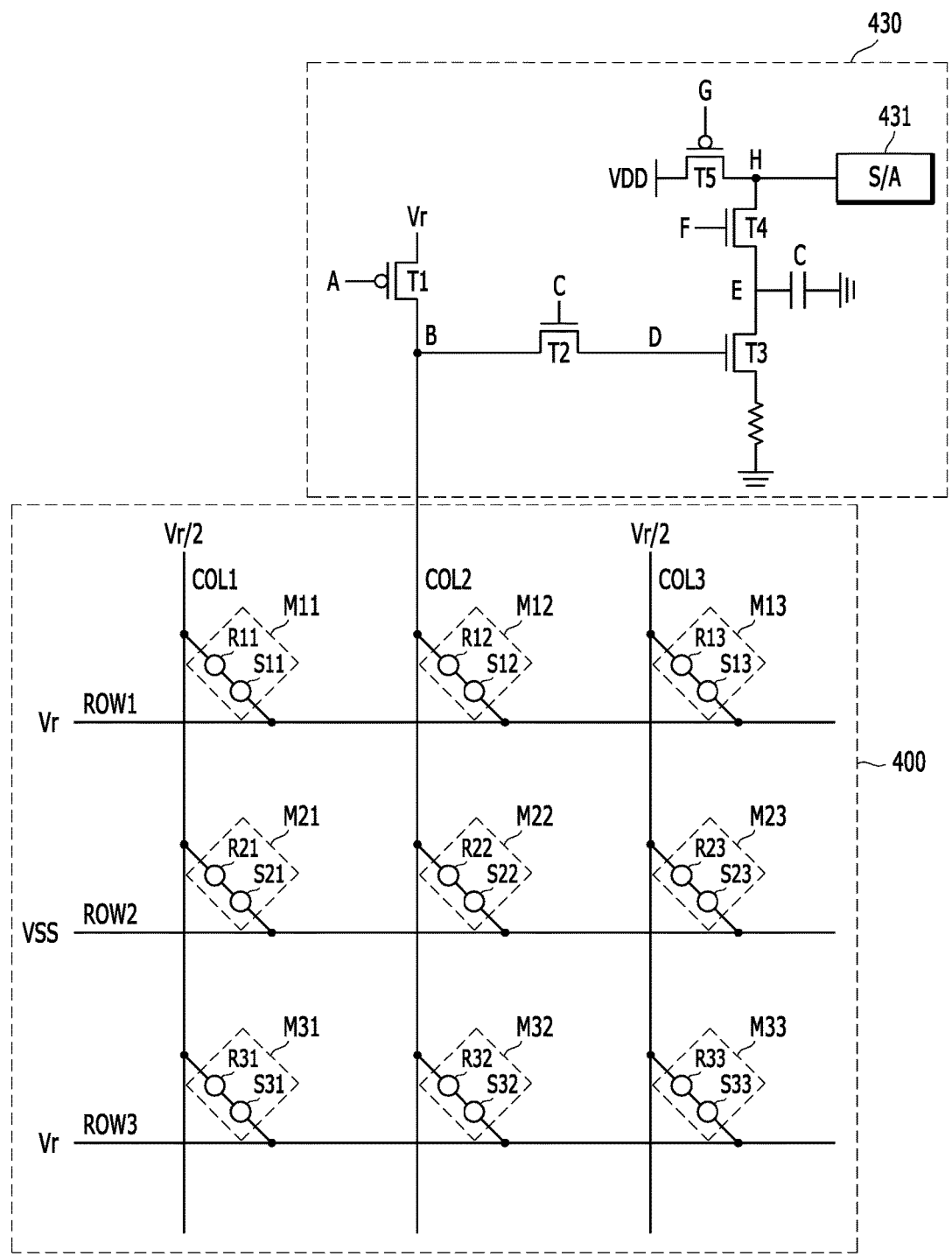
FIG. 5 is a diagram illustrating voltages applied to column lines and row lines in a read operation, and a read circuit.

FIG. 5 illustrates voltages applied to the column lines COL1 to COL3 and the row lines ROW1 to ROW3 and a configuration of the read circuit 430 in a read operation. Hereinafter, it is to be assumed that the column line COL2 is a selected column line; the row line ROW2 is a selected row line; and the memory cell M22 is a selected memory cell.

Referring to FIG. 5, a ground voltage VSS may be applied to the selected row line ROW2, and a read voltage Vr may be applied to the unselected row lines ROW1 and ROW3. The voltages applied to the row lines ROW1 to ROW3 may be provided by the row decoder 470. The selected column line COL2 may be coupled to the read circuit 430. In addition, a voltage Vr/2 which is half of the read voltage Vr may be applied to the unselected column lines COL1 and COL3. The coupling between the selected column line COL2 and the read circuit 430 and the application of the voltage Vr/2 to the unselected column lines COL1 and COL3 may be performed by the column decoder 450. In this embodiment, since voltage differences between both ends of each of the unselected memory cells M11, M12, M13, M21, M23, M31, M32, and M33 in a read operation are small, e.g., Vr/2, current may not flow through the unselected memory cells M11, M12, M13, M21, M23, M31, M32, and M33.

The read circuit 430 may apply the read voltage Vr to the selected memory cell M22 through the selected column line COL2 and sense data stored in the selected memory cell M22 by sensing whether or not a snapback phenomenon occurs in the selected memory cell M22. Whether or not the snapback phenomenon has occurred may be determined by sensing a voltage change at both ends of the selected memory cell M22 after the read voltage Vr is applied to the selected memory cell M22.

The read circuit 430 may include a first transistor T1 for applying the read voltage Vr to a node B which is coupled to the selected column line COL2; a second transistor T2 for transferring a voltage level of the node B to a node D; a third transistor T3 for discharging charges of a charge node E in response to a voltage level of the node D; a resistor R coupled to and disposed between the transistor T3 and a ground voltage terminal; a capacitor C coupled to and disposed between the charge node E and the ground voltage terminal; a fourth transistor T4 electrically coupling the charge node E to a sensing node H; a fifth transistor T5 for transferring a precharge voltage VDD to the sensing node H; and a sense amplifier 431 for sensing a voltage level of the sensing node H, wherein the transistors T1, T2, and T3 to which a high voltage is applied may be designed to endure the high voltage.

Figure 6:
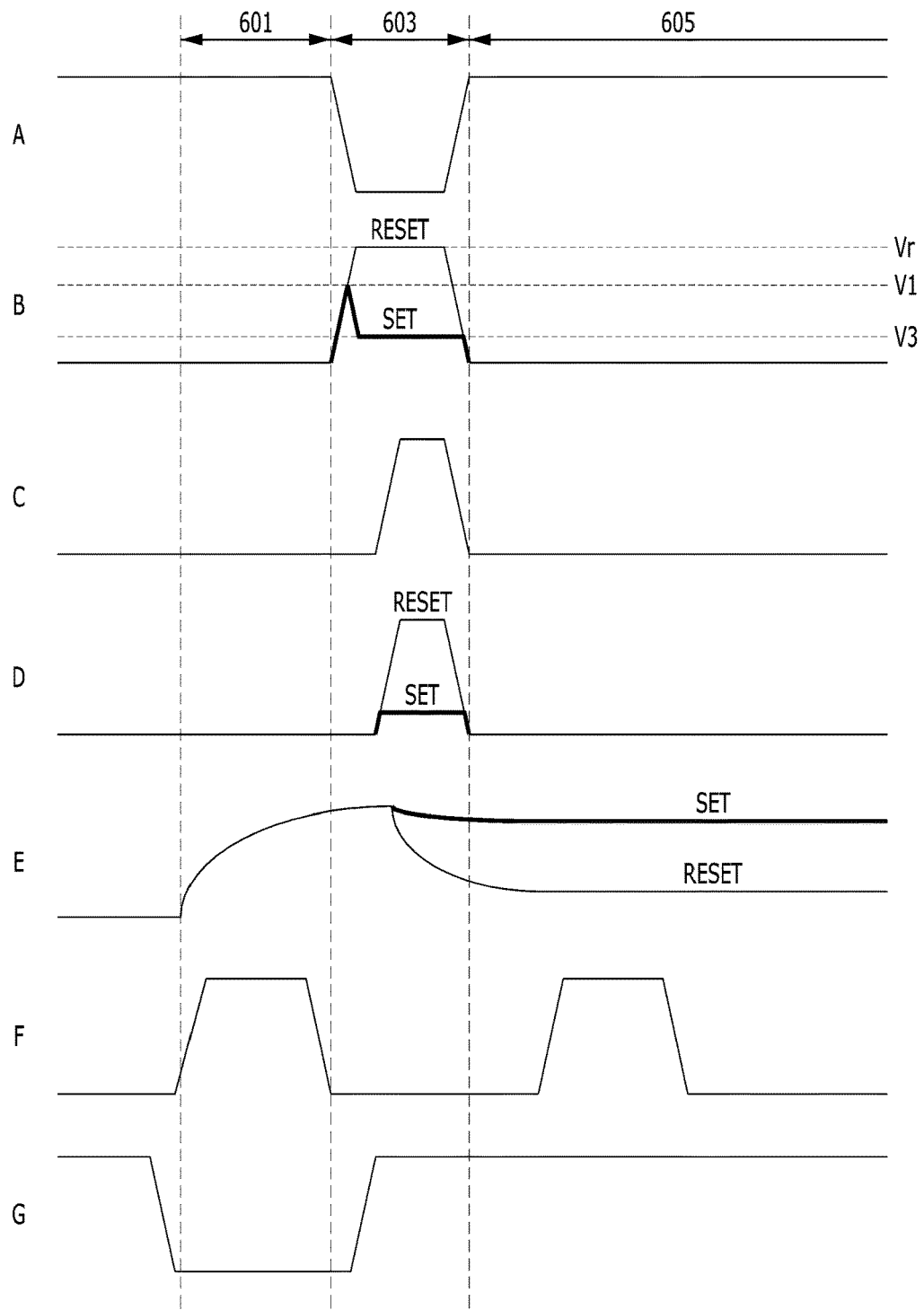
FIG. 6 is a diagram illustrating voltage levels of nodes of the read circuit shown in FIG. 5 in the read operation.

FIG. 6 illustrates voltage levels of nodes A, B, C, D, E, F and G of the read circuit 430 shown in FIG. 5, in a read operation. The operation of the read circuit 430 shown in FIG. 5 will be described in detail with reference to FIG. 6.

Referring to FIG. 6, in the read operation, the read circuit 430 may proceed in the order of a precharge period 601, a read voltage application period 603, and a sensing period 605.

In the precharge period 610, a voltage level of the node G may transition to a low level 'LOW' and thus the fifth transistor T5 may be turned on. As a result of the fifth transistor T5 being turned on, the supply voltage VDD may be transferred to the sensing node H as a precharge voltage. In addition, a voltage level of the node F may transition to a high level 'HIGH' and thus the fourth transistor T4 may be turned on. Thus a voltage level of the sensing node H may be transferred to the charge node E, and a voltage level of the charge node E may be raised. That is, in the precharge period 601, the voltage level of the charge node E coupled to the capacitor C may be gradually raised, and thus the capacitor C is charged.

In the read voltage application period 603 following the precharge period 601, a voltage level of the node A may transition to a low level 'LOW' and thus the first transistor T1 may be turned on. As the first transistor T1 is turned on, the read voltage Vr may be applied to the node B, i.e., the selected column line COL2, and as a result, the read voltage Vr may be applied to the selected memory cell M22. If the selected memory cell M22 is in a low resistance state (a SET state), i.e., if first data is stored in the selected memory cell M22, a snapback phenomenon may occur in the selected memory cell M22 when the voltage level of the node B reaches the first voltage V1. That is, if the read voltage Vr is applied to the node B coupled to the selected memory cell M22, a voltage level of the node B may rise up to a level of the first voltage V1 and then drop to a level of the third voltage V3 due to the snapback phenomenon.

On the other hand, if the selected memory cell M22 is in a high resistance state (a RESET state), i.e., if second data is stored in the selected memory cell M22, the snapback phenomenon may not occur in the selected memory cell M22 even though the read voltage Vr is applied to the node B because the snapback phenomenon occurs when the voltage level of the node B reaches the second voltage V3 that is higher than the read voltage Vr. Therefore, the voltage level of the node B may rise up to the read voltage Vr.

In the read voltage application period 603, a voltage level of the node C may transition to 'HIGH' in a predetermined time after the read voltage Vr is applied to the node B, and thus the transistor T2 may be turned on in response to the voltage level of the node C. The predetermined time may be determined based on whether or not the snapback phenomenon has occurred in the selected memory cell M22.

As the transistor T2 is turned on, the voltage level of the node B may be transferred to the node D. Therefore, if the selected memory cell M22 is in a low resistance state (a SET state), a voltage level of the node D may have a low level. On the other hand, if the selected memory cell M22 is in a high resistance state (a RESET state), the voltage level of the node D may have a high level. When the node D is in a low level, i.e., when the selected memory cell M22 is in a low resistance state (a SET state), the third transistor T3 is turned off and thus a voltage level of the charge node E may maintain a precharge level. On the other hand, when the node D is in a high level, i.e., when the selected memory cell M22 is in a high resistance state (a RESET state), the third transistor T3 is turned on and thus the charge node E may not maintain a precharge level and may drop to a voltage level lower than the precharge level.

In the sensing period 605 following the read voltage application period 603, a voltage level of the node F may transition to a high level 'HIGH' from a low level 'LOW' in the read voltage application period 603, and thus the fourth transistor T4 may be turned on so that a voltage level of the charge node E may be transferred to the sensing node H. If a voltage level of the sense node H is high, the sense amplifier 431 may determine data stored in the selected memory cell M22 as the first data, and if a voltage level of the sense node H is low, the sense amplifier 431 may determine data stored in the selected memory cell M22 as the second data. As the sense amplifier 431 is configured to sense a voltage, it may include a simple circuit.

According to the above embodiment, the read voltage Vr is applied to the selected memory cell M22 in the read operation, wherein the read voltage Vr is higher than the first voltage V1 but lower than the second voltage V2. As a result, whether or not a snapback phenomenon occurs in the selected memory cell M22 is determined according to a logic level of data stored in the selected memory cell M22.

In the selected memory cell M22, there is a significant difference between a voltage level of the node B when a snapback phenomenon occurs and a voltage level of the node B when the snapback phenomenon does not occur. Thus, as the read circuit 430 senses stored data using such a voltage difference, the read circuit 430 may sense the data of the selected memory cell with very high accuracy since the read circuit 430 can secure a high sensing margin from the big voltage difference.

The above and other memory circuits or semiconductor devices based on the disclosed technology can be used in a range of devices or systems. FIGS. 7-11 provide some examples of devices or systems that can implement the memory circuits disclosed herein.

Figure 7:
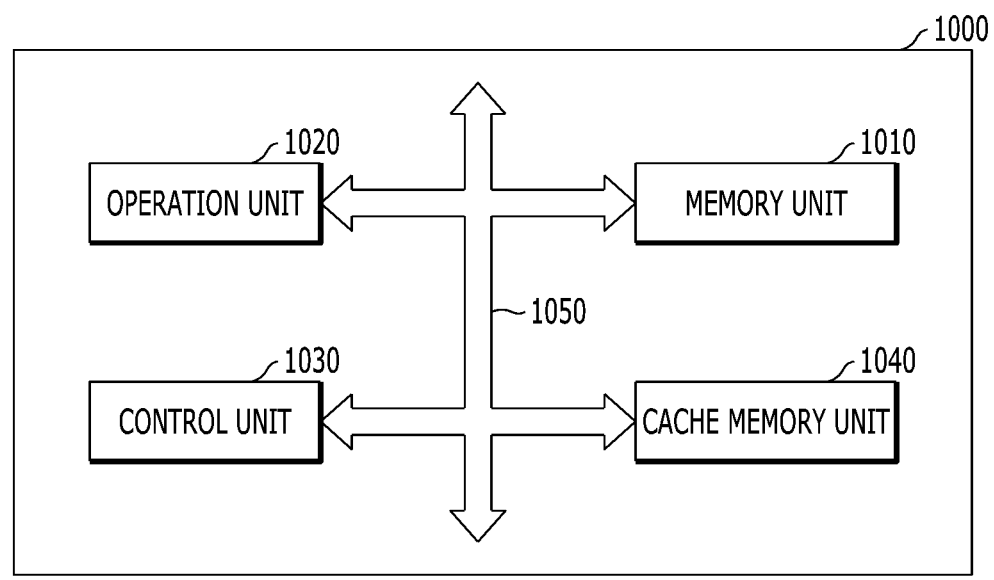
FIG. 7 shows an example of a configuration diagram of a microprocessor implementing memory circuitry based on the disclosed technology.

FIG. 7 shows an example of a configuration diagram of a microprocessor based on another implementation of the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described memory circuits in accordance with the implementations. For example, the memory unit 1010 implementation may include a cell array including a plurality of resistive memory cells arranged in a plurality of columns and a plurality of rows, and a read circuit configured to apply a read voltage to both ends of a memory cell selected among the plurality of resistive memory cells, and sense data by determining whether or not a snapback phenomenon has occurred in the selected memory cell, wherein the read voltage is higher than a level of a first voltage which causes the snapback phenomenon when being applied to both ends of the selected memory cell in the case where data stored in the selected memory cell is first data, and is lower than a level of a second voltage which causes the snapback phenomenon when being applied to both ends of the selected memory cell in the case where data stored in the selected memory cell is second data. Through this, the read operation of the memory unit 1010 may be improved. Since the memory unit 1010 according to the present implementation may be improved in operating precision, the microprocessor 1000 may be improved in performance.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
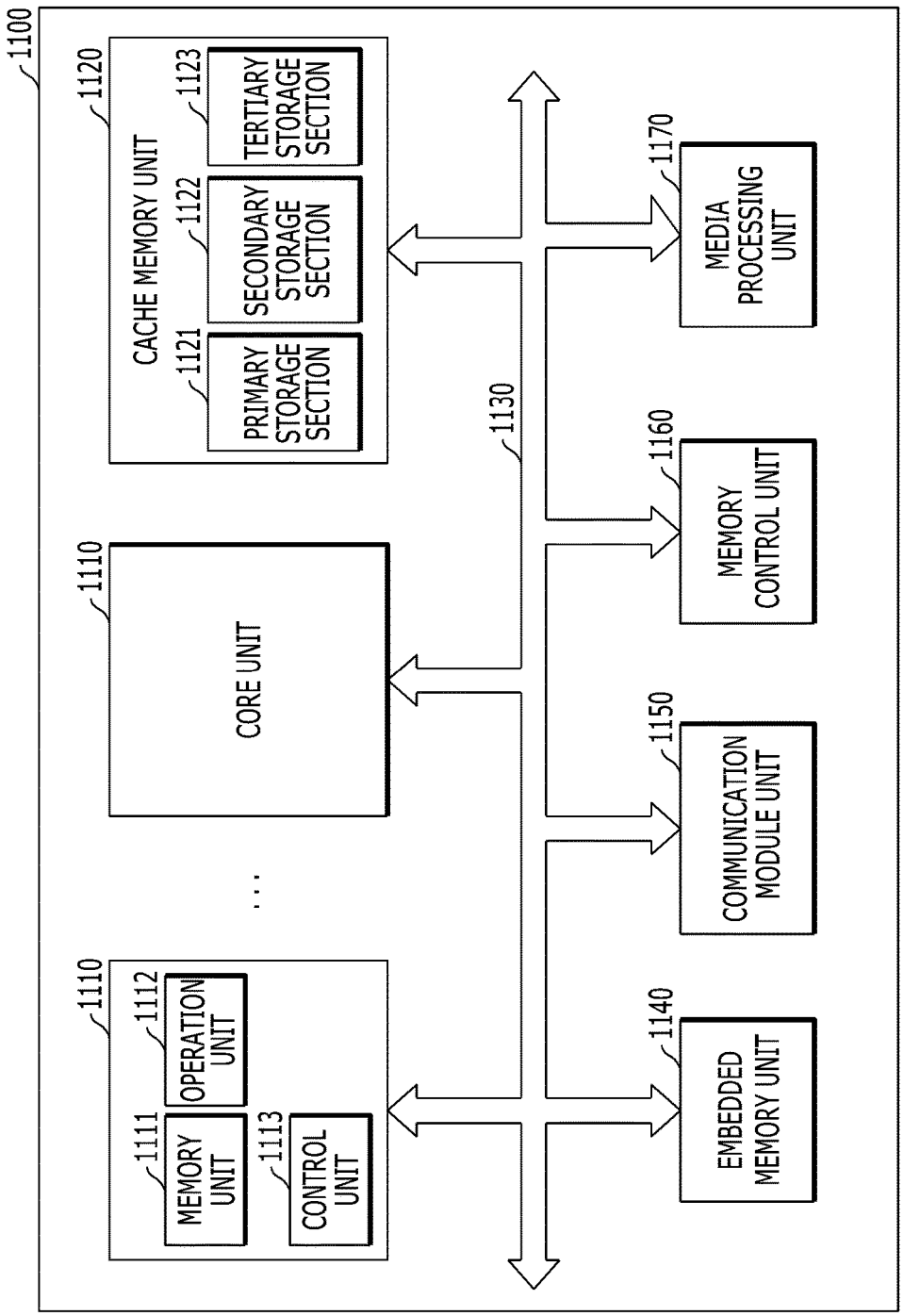
FIG. 8 shows an example of a configuration diagram of a processor implementing memory circuitry based on the disclosed technology.

FIG. 8 is a configuration diagram of a processor based on another implementation of the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described memory circuits in accordance with the implementations. For example, the cache memory unit 1120 implementation may include a cell array including a plurality of resistive memory cells arranged in a plurality of columns and a plurality of rows, and a read circuit configured to apply a read voltage to both ends of a memory cell selected among the plurality of resistive memory cells, and sense data by determining whether or not a snapback phenomenon has occurred in the selected memory cell, wherein the read voltage is higher than a level of a first voltage which causes the snapback phenomenon when being applied to both ends of the selected memory cell in the case where data stored in the selected memory cell is first data, and is lower than a level of a second voltage which causes the snapback phenomenon when being applied to both ends of the selected memory cell in the case where data stored in the selected memory cell is second data. Through this, the read operation of the cache memory unit 1120 may be improved. Since the cache memory unit 1120 according to the present implementation may be improved in operating precision, the core unit 1110 may be improved in performance.

Although it was shown in FIG. 8 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
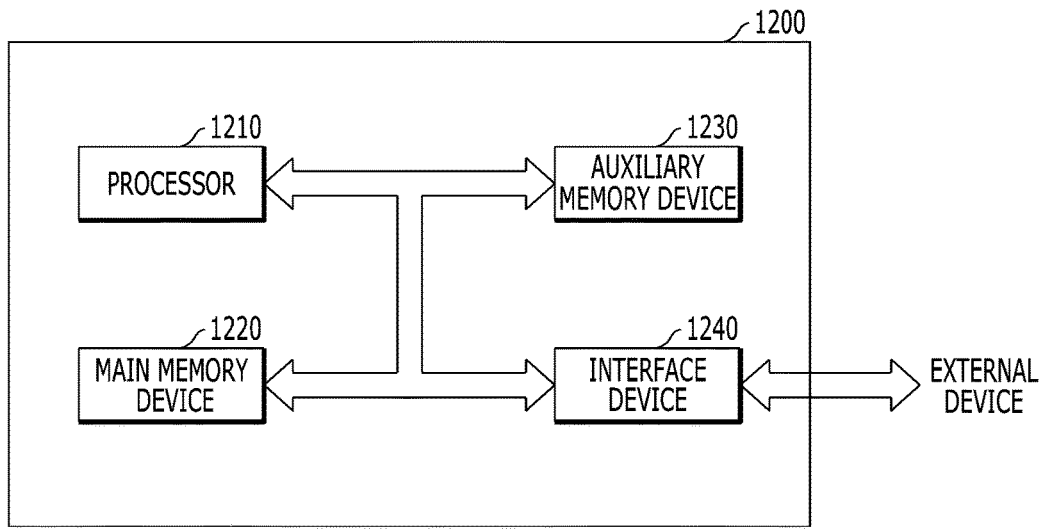
FIG. 9 shows an example of a configuration diagram of a system implementing memory circuitry based on the disclosed technology.

FIG. 9 is a configuration diagram of a system based on another implementation of the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a cell array including a plurality of resistive memory cells arranged in a plurality of columns and a plurality of rows, and a read circuit configured to apply a read voltage to both ends of a memory cell selected among the plurality of resistive memory cells, and sense data by determining whether or not a snapback phenomenon has occurred in the selected memory cell, wherein the read voltage is higher than a level of a first voltage which causes the snapback phenomenon when being applied to both ends of the selected memory cell in the case where data stored in the selected memory cell is first data, and is lower than a level of a second voltage which causes the snapback phenomenon when being applied to both ends of the selected memory cell in the case where data stored in the selected memory cell is second data. Through this, the operating precision of the main memory device 1220 may be improved. Since the main memory device 1220 according to the present implementation may be improved in operating precision, the system 1200 may be improved in portability and performance.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a cell array including a plurality of resistive memory cells arranged in a plurality of columns and a plurality of rows, and a read circuit configured to apply a read voltage to both ends of a memory cell selected among the plurality of resistive memory cells, and sense data by determining whether or not a snapback phenomenon has occurred in the selected memory cell, wherein the read voltage is higher than a level of a first voltage which causes the snapback phenomenon when being applied to both ends of the selected memory cell in the case where data stored in the selected memory cell is first data, and is lower than a level of a second voltage which causes the snapback phenomenon when being applied to both ends of the selected memory cell in the case where data stored in the selected memory cell is second data. Through this, the operating precision of the auxiliary memory device 1230 may be improved. Since the auxiliary memory device 1230 according to the present implementation may be improved in operating precision, the system 1200 may be improved in performance.

Also, the auxiliary memory device 1230 may further include a data storage system (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wi-bro), high speed downlink packet access (HSDPA), wideband CDMA (WCDMA), ultra wideband (UWB), such as various devices which send and receive data without transmit lines, and so on.

Figure 10:
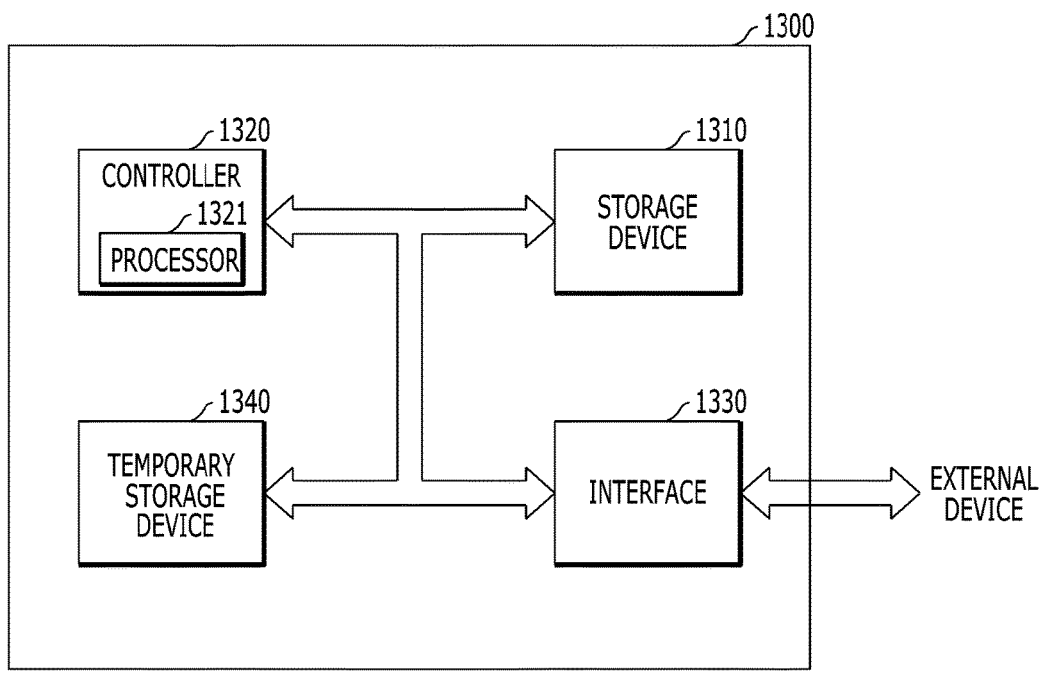
FIG. 10 shows an example of a configuration diagram of a data storage system implementing memory circuitry based on the disclosed technology.

FIG. 10 is a configuration diagram of a data storage system based on another implementation of the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily implementation for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 implementation may include a cell array including a plurality of resistive memory cells arranged in a plurality of columns and a plurality of rows, and a read circuit configured to apply a read voltage to both ends of a memory cell selected among the plurality of resistive memory cells, and sense data by determining whether or not a snapback phenomenon has occurred in the selected memory cell, wherein the read voltage is higher than a level of a first voltage which causes the snapback phenomenon when being applied to both ends of the selected memory cell in the case where data stored in the selected memory cell is first data, and is lower than a level of a second voltage which causes the snapback phenomenon when being applied to both ends of the selected memory cell in the case where data stored in the selected memory cell is second data. Through this, read operation of the storage device 1310 or the temporary storage device 1340 may be improved. Since the storage device 1310 or the temporary storage device 1340 according to the present implementation may be improved in operating precision, the data storage system 1300 may be improved in performance.

Figure 11:
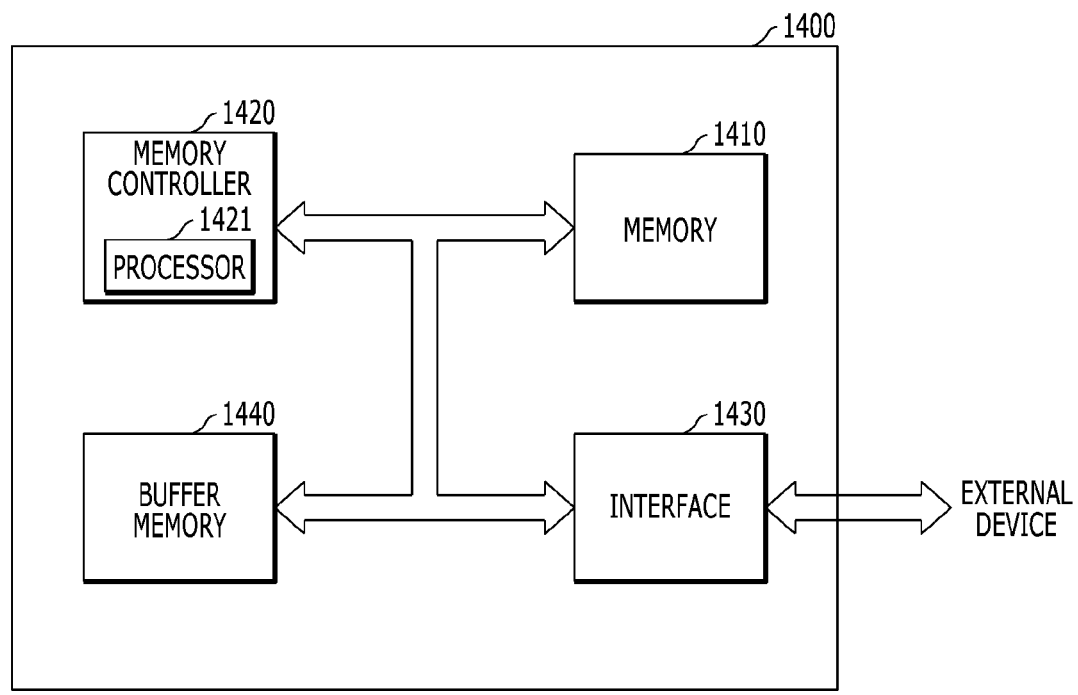
FIG. 11 shows an example of a configuration diagram of a memory system implementing memory circuitry based on the disclosed technology.

FIG. 11 is a configuration diagram of a memory system based on another implementation of the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a cell array including a plurality of resistive memory cells arranged in a plurality of columns and a plurality of rows, and a read circuit configured to apply a read voltage to both ends of a memory cell selected among the plurality of resistive memory cells, and sense data by determining whether or not a snapback phenomenon has occurred in the selected memory cell, wherein the read voltage is higher than a level of a first voltage which causes the snapback phenomenon when being applied to both ends of the selected memory cell in the case where data stored in the selected memory cell is first data, and is lower than a level of a second voltage which causes the snapback phenomenon when being applied to both ends of the selected memory cell in the case where data stored in the selected memory cell is second data. Through this, read operation of the memory 1410 may be improved. Since the memory 1410 according to the present implementation may be improved in operating precision, the memory system 1400 may be improved in performance.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described memory circuits in accordance with the implementations. The buffer memory 1440 implementation may include a cell array including a plurality of resistive memory cells arranged in a plurality of columns and a plurality of rows, and a read circuit configured to apply a read voltage to both ends of a memory cell selected among the plurality of resistive memory cells, and sense data by determining whether or not a snapback phenomenon has occurred in the selected memory cell, wherein the read voltage is higher than a level of a first voltage which causes the snapback phenomenon when being applied to both ends of the selected memory cell in the case where data stored in the selected memory cell is first data, and is lower than a level of a second voltage which causes the snapback phenomenon when being applied to both ends of the selected memory cell in the case where data stored in the selected memory cell is second data. Through this, read operation of the buffer memory 1440 may be improved. Since the buffer memory 1440 according to the present implementation may be improved in operating precision, the memory system 1400 may be improved in performance.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, the semiconductor memory comprising:
   a cell array including a plurality of resistive memory cells arranged in a plurality of columns and a plurality of rows, the plurality of resistive memory cells having a snapback characteristic; and
   a read circuit configured to apply a read voltage to a memory cell selected among the plurality of resistive memory cells, and sense data stored in the selected memory cell by determining whether or not a snapback phenomenon has occurred in the selected memory cell,
   wherein the read voltage has a level higher than a level of a first voltage and lower than a level of a second voltage,
   wherein the snapback phenomenon occurs when the first voltage is applied to the selected memory cell in a case where the selected memory cell stores first data, and
   wherein the snapback phenomenon occurs when the second voltage is applied to the selected memory cell in a case where the selected memory cell stores second data, and
   wherein the read circuit comprises:
   a charge node configured to be pre-charged to a high level before applying the read voltage to the selected memory cell, be discharged or not in response to an occurrence of the snapback phenomenon of the selected memory cell when the read voltage is applied to the selected memory cell;
   a sensing node configured to be electrically connected to the charge node after applying the read voltage to the selected memory cell; and
   a sense amplifier configured to sense a voltage level of the sensing node.

2. The electronic device of claim 1,
   wherein each of the plurality of resistive memory cells comprises:
   a variable resistance element having a high resistance state or a low resistance state according to a logic value of stored data; and
   a selection element electrically coupled in series with the variable resistance element, and
   wherein the selection element has the snapback characteristic.

3. The electronic device of claim 2, wherein the selection element is an Ovonic Threshold Switch (OTS) element.

4. The electronic device of claim 1,
   wherein the cell array comprises a plurality of column lines and a plurality of row lines, and
   wherein each of the plurality of resistive memory cells is electrically coupled to a corresponding one of the plurality of column lines and a corresponding one of the plurality of row lines.

5. The electronic device according to claim 1, further comprising a microprocessor which includes:
   a control unit that is configured to receive a signal including a command from an outside of the microprocessor, and performs extracting, decoding of the command, or controlling input or output of a signal of microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory is part of the memory unit in the microprocessor.

6. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory is part of the cache memory unit in the processor.

7. The electronic device according to claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between the processor, the auxiliary memory device or the main memory device and the outside,
   wherein the semiconductor memory is part of the auxiliary memory device or the main memory device in the processing system.

8. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory is part of the storage device or the temporary storage device in the data storage system.

9. The electronic device according to claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory is part of the memory or the buffer memory in the memory system.

10. An electronic device including a semiconductor memory, the semiconductor memory comprising:

a cell array including a plurality of resistive memory cells arranged in a plurality of columns and a plurality of rows, the plurality of resistive memory cells having a snapback characteristic; and a read circuit configured to apply a read voltage to a memory cell selected among the plurality of resistive memory cells, and sense data stored in the selected memory cell by determining whether or not a snapback phenomenon has occurred in the selected memory cell, wherein the read voltage has a level higher than a level of a first voltage and lower than a level of a second voltage, wherein the snapback phenomenon occurs when the first voltage is applied to the selected memory cell in a case where the selected memory cell stores first data, wherein the snapback phenomenon occurs when the second voltage is applied to the selected memory cell in a case where the selected memory cell stores second data, and wherein the read circuit comprises:

a first transistor configured to apply the read voltage to a column line coupled to the selected memory cell;

a second transistor configured to transfer a voltage level of the column line coupled to the selected memory cell to a first node;

a third transistor configured to discharge charges of a charge node in response to a voltage level of the first node;

a capacitor electrically coupled to the charge node;

a fourth transistor configured to electrically couple the charge node and a sensing node;

a fifth transistor configured to transfer a precharge voltage to the sensing node; and a sense amplifier configured to sense a voltage level of the sensing node.

11. The electronic device of claim 10, wherein an operation of the read circuit is performed in order of a precharge period, a read voltage application period and a sensing period, wherein the fifth transistor and the fourth transistor are turned on during the precharge period, wherein the first transistor is turned on during the read voltage application period, and the second transistor is turned on at a time later than the first transistor is turned on during the read voltage application period, and wherein the fourth transistor is turned on during the sensing period.

12. A method for reading data stored in a semiconductor memory, the method comprising:

pre-charging a charge node to a high level;

applying a read voltage to a memory cell having a snapback characteristic;

discharging the charge node when a snapback phenomenon occurs in the memory cell;

connecting the charge node to a sensing node after the read voltage is applied to the memory cell; and sensing data stored in the memory cell by determining a voltage level of the sensing node, wherein the read voltage has a level higher than a level of a first voltage and lower than a level of a second voltage, wherein the snapback phenomenon occurs when the first voltage is applied to the memory cell in a case where the memory cell stores first data, and wherein the snapback phenomenon occurs when the second voltage is applied to the memory cell in a case where the memory cell stores second data.

13. The method of claim 12, wherein the memory cell comprises:

a variable resistance element; and a selection element electrically coupled in series with the variable resistance element, and wherein the selection element has the snapback characteristic.

* * * * *